United States Patent

Larson

[11] Patent Number: 6,019,037
[45] Date of Patent: Feb. 1, 2000

[54] METHOD FOR SCREEN PRINTING PATTERNS ON A TARGET OBJECT

[75] Inventor: Charles Larson, Nampa, Id.

[73] Assignee: Micron Technology, Inc., Boise, Id.

[21] Appl. No.: 09/127,813

[22] Filed: Aug. 3, 1998

[51] Int. Cl.⁷ .................................................. B41C 1/12
[52] U.S. Cl. .................. 101/129; 427/383.1; 427/383.4; 118/406
[58] Field of Search .............................. 101/129, 128.21, 101/128.24, 424.1, 488, 490; 427/383.1, 384; 118/406

[56] References Cited

U.S. PATENT DOCUMENTS

| | | | |
|---|---|---|---|
| 4,971,083 | 11/1990 | Stach et al. | 134/57 R |
| 4,994,434 | 2/1991 | Hung et al. | 505/826 |
| 5,047,283 | 9/1991 | Leatherman et al. | 428/209 |
| 5,164,816 | 11/1992 | Nishizawa et al. | 257/759 |
| 5,368,883 | 11/1994 | Beaver | 101/128.21 |
| 5,699,733 | 12/1997 | Chang et al. | 101/129 |
| 5,809,880 | 9/1998 | Okuda et al. | 101/128.21 |

*Primary Examiner*—Eugene H. Eickholt
*Attorney, Agent, or Firm*—Dickstein Shapiro Morin & Oshinsky LLP

[57] ABSTRACT

The present invention is embodied in a method for screen printing a target object, such as a substrate, which allows for the removal of a misaligned screen printed pattern without causing damage to the target object. A removable barrier layer is applied to the substrate and the pattern screen printed on the removable barrier layer. If the pattern is not properly aligned, the removable barrier layer with the screen printed pattern attached is removed from the substrate and the substrate can be reprinted. If the pattern is properly aligned, only the removable barrier layer is removed and the pattern drops onto and adheres to the substrate.

45 Claims, 5 Drawing Sheets

METHOD FOR SCREEN PRINTING PATTERNS ON A TARGET OBJECT

BACKGROUND OF THE INVENTION

1. Field of the Invention

The present invention relates to a method of screen printing a pattern on a target object, and more particularly to a method of screen printing a printed pattern on a substrate utilizing a removable barrier layer to ensure proper alignment of the printed pattern.

2. Description of the Related Art

The manufacture of substrates such as printed circuit boards, Integrated Circuit (IC) chips or wafers requires the screen printing of patterns of symbols, passive elements, wiring portions, or the like on the surface of the substrate. The alignment of the pattern on the substrate is critical, as a misaligned pattern can result in an unusable substrate due to misaligned symbols or an inoperative circuit due to misaligned wiring portions.

In screen printing, a silk screen of the pattern desired to be transferred to the substrate is aligned with and secured to the substrate with an epoxy adhesive. However, this has a disadvantage in that once the pattern is placed on and adhered to the substrate, it may not be removed without causing damage to the substrate itself. Since the proper alignment of the pattern may be crucial to the proper operation of the substrate in the end circuit, the only recourse for a substrate having a misaligned pattern is to reject the entire substrate, as there is no way to remove the misaligned pattern to rework the screen printing without damaging the substrate. This results in a waste of materials, as an entire substrate must be rejected based upon a misaligned print pattern.

FIG. 1 shows an example of a properly aligned solder bond pattern on a substrate. Substrate 10 may be a printed wiring board, IC chip or the like, on which it is necessary to print a solder bond pattern properly aligned with the areas 11–14 and 16–19. Assuming, for example, it is desired to print a pattern 20 consisting of eight solder bond pads 21–24 and 26–29 corresponding to areas 11–14 and 16–19 on substrate 10, the pattern 20 would be lined up with substrate 10 and applied to substrate 10 with an adhesive (not shown), such as an epoxy based adhesive or a polyimid siloxane adhesive. If the pattern 20 is properly aligned, the solder bond pads 21–24 and 26–29 will be properly aligned with areas 11–14 and 16–19 of substrate 10 as shown by the complete substrate with pattern 30.

FIG. 2 shows an example of a misaligned pattern on a substrate. Substrate 110 may be a printed wiring board, IC chip, wafer or the like, on which it is necessary to print a pattern properly aligned with the areas 111–114 and 116–119. Assuming, for example, it is desired to print a pattern 120 consisting of eight bond pads 121–124 and 126–129 corresponding to areas 111–114 and 116–119 on substrate 110, the pattern 120 would be lined up with substrate 110 and applied to substrate 110 with an adhesive (not shown), typically an epoxy based adhesive or a polyimid siloxane adhesive. If the pattern 120 is properly aligned, the bond pads 121–124 and 126–129 will be properly aligned with areas 111–114 and 116–119 of substrate 110. However, if the pattern 120 is not properly aligned, then bond pads 121–124 and 126–129 will not be properly aligned with areas 111–114 and 116–119 as shown by the complete substrate with misaligned pattern 130. In this instance, since the misaligned pattern 120 could cause improper operation of the complete substrate 130, it is necessary to remove the pattern 120 from substrate 110 and rework the substrate 110 to properly align the pattern 120. However, since the adhesive used to secure pattern 120 to substrate 110 may be partially absorbed by substrate 110, it may not be possible to remove the misaligned pattern 120 from the substrate 110 without causing damage to substrate 110. Thus, it is necessary to reject the entire complete substrate 130, resulting in a waste of material.

Thus, there exists the problem of being able to screen print a substrate in which a misaligned pattern can be removed without causing damage to the substrate.

SUMMARY OF THE INVENTION

The present invention provides a unique method for screen printing a substrate utilizing a removable barrier layer between the substrate and printed screen pattern. The barrier layer is placed over the substrate and the printed feature is attached to the barrier layer. If the pattern does not align properly on the substrate, the barrier layer and pattern can be easily removed without causing damage to the substrate, and the substrate can be reprinted with a properly aligned pattern. If the pattern is properly aligned, the barrier layer is removed and the printed feature drops to the substrate for adhesion.

In accordance with a first embodiment of the present invention, a barrier layer is formed on the substrate by a thin layer of liquid carbon dioxide ($CO_2$). The pattern is printed on the liquid $CO_2$ layer. If the pattern is properly aligned, the $CO_2$ layer is allowed to evaporate, which permits the epoxy adhesive to adhere the pattern to the substrate. If the pattern is misaligned, the pattern, adhesive and $CO_2$ layers can be removed without causing damage to the substrate, and the substrate can be reprinted.

In accordance with a second embodiment of the present invention, a barrier layer is formed by a layer of rosin flux coated on the substrate. A pattern is screen printed on the layer of rosin flux utilizing an epoxy adhesive. If the pattern is properly aligned, the rosin flux layer is removed by heat, allowing the epoxy adhesive to adhere the pattern to the substrate. If the pattern is misaligned, the pattern, adhesive and rosin flux layers can be removed without causing damage to the substrate and the substrate can be reprinted.

In accordance with a third embodiment of the present invention, a barrier layer is formed by a layer of paraffin coated on the substrate. A pattern is screen printed on the layer of paraffin utilizing an epoxy adhesive. If the pattern is properly aligned, the paraffin layer is removed by heat, allowing the epoxy adhesive to adhere the pattern to the substrate. If the pattern is misaligned, the pattern, adhesive and paraffin layers can be removed without causing damage to the substrate and the substrate can be reprinted.

These and other advantages and features of the invention will become apparent from the following detailed description of the invention which is provided in connection with the accompanying drawings.

DETAILED DESCRIPTION OF THE PREFERRED EMBODIMENTS

The present invention will be described as set forth in the preferred embodiments illustrated in FIGS. 3–5. Other embodiments may be utilized and structural or logical changes may be made without departing from the scope of the present invention.

Figure 3:
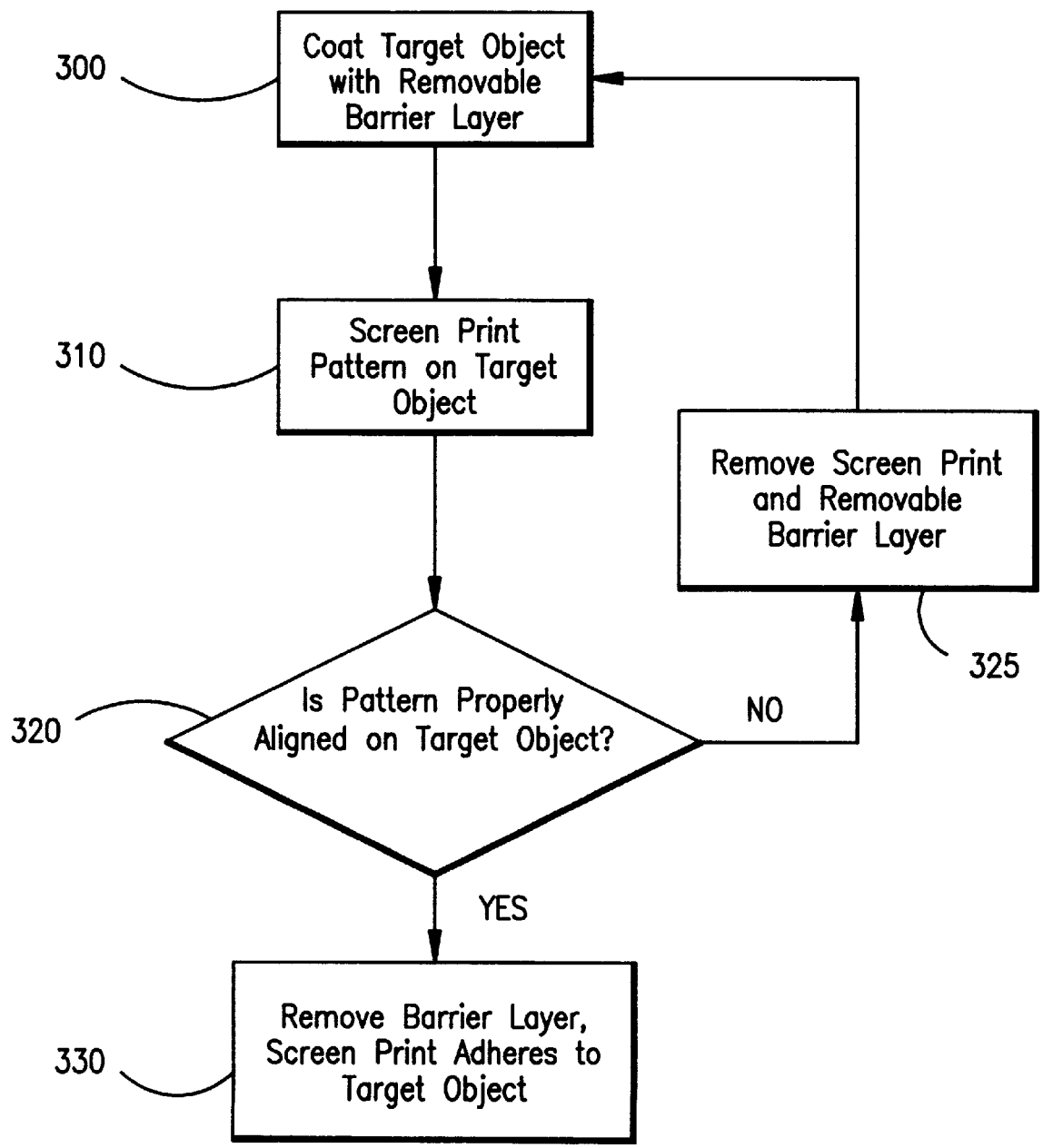
FIG. 3 illustrates in flow chart form the steps of the screen printing method in accordance with the present invention.

FIG. 3 illustrates the steps for screen printing a target object, such as a substrate, in accordance with the method of the present invention. In step 300, a target object to be subjected to a screen print is coated with a removable barrier layer, the process of which will be discussed with reference to FIG. 4. The barrier layer must be formed of a material which is not reactive with either the target object or adhesive used to secure the screen print to the target object.

After the target object has been provided with the removable barrier layer in step 300, the target object is screen printed with the desired pattern in step 310 utilizing techniques known in the art. Since the target object is coated with a barrier layer, the adhesive used to secure the screen print is not in direct contact with the target object, but instead only in contact with the barrier layer.

In step 320, an inspection of the pattern screen printed on the target object is performed to determine if the pattern is properly aligned on the target object. If the pattern is not properly aligned, the screen printed pattern and barrier layer are removed from the target object in step 325. Since the screen print was applied on top of the barrier layer and not directly to the target object, the removal of the barrier layer and screen printed pattern will not cause damage to the target object, and the target object can be cleaned, coated with barrier layer (step 300) and screen printed again in step 310. If the pattern is properly aligned on the target object, only the barrier layer is removed in step 330, allowing the screen printed pattern to drop onto the target object and adhere to the target object.

Figure 4:
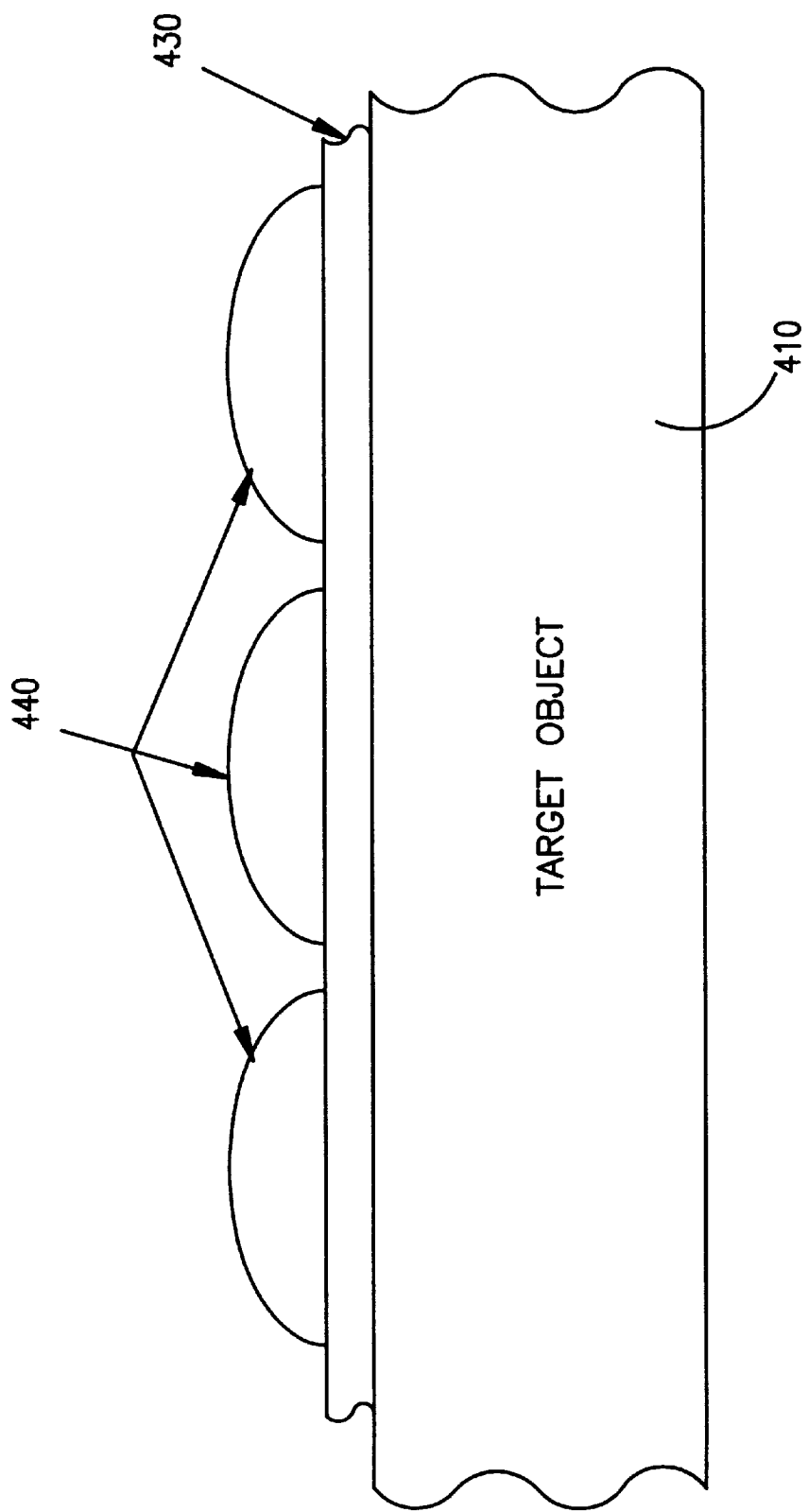
FIG. 4 illustrates a side view of the use of a barrier layer on a target object in accordance with the present invention.
Figure 5:
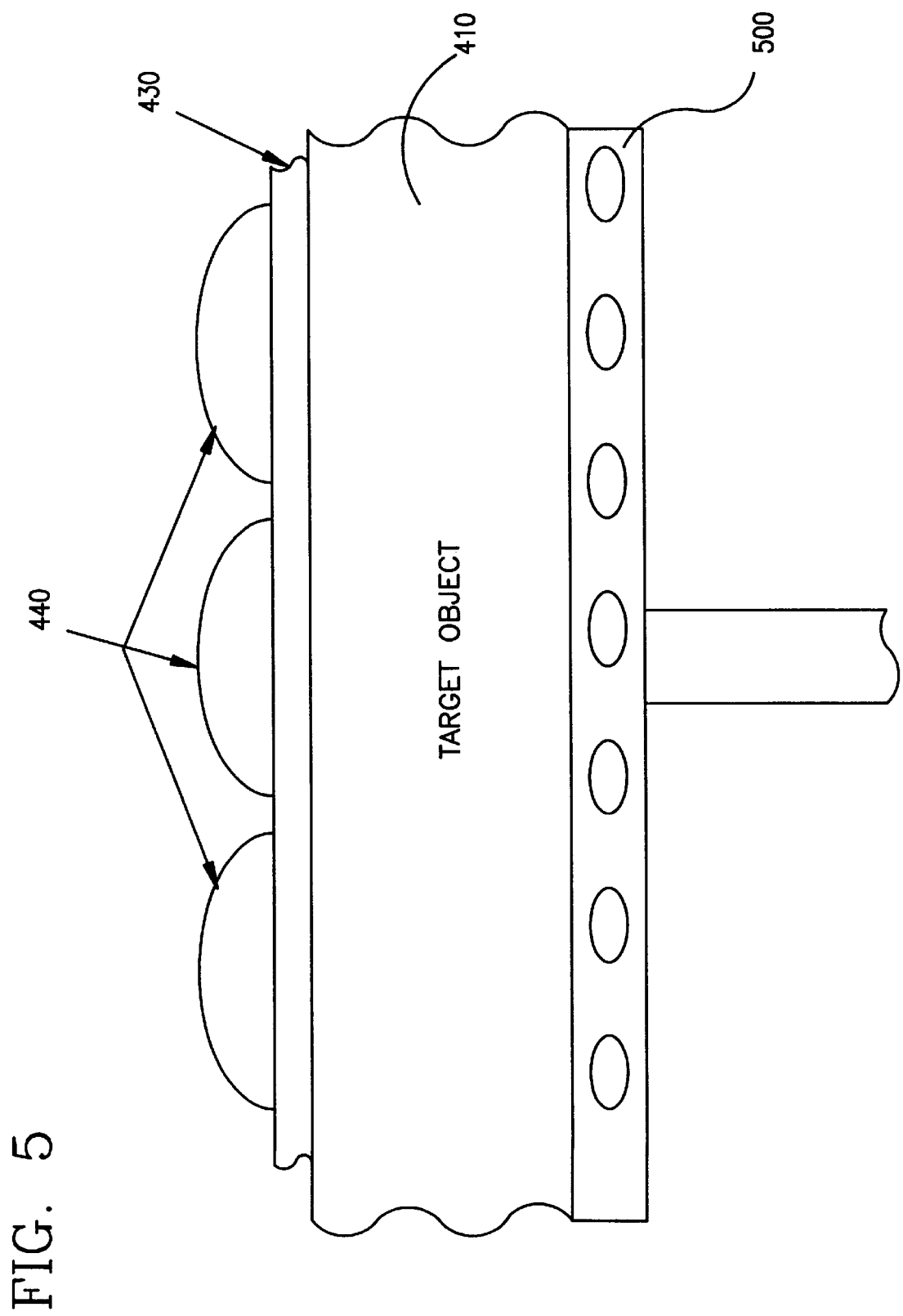
FIG. 5 illustrates a method for keeping a target object cool when utilizing a first embodiment of the present invention.

FIG. 4 illustrates the use of a barrier layer during a screen printing process in accordance with the method of the present invention. A target object 410 is to be subjected to printing by a screen printing method. The target object 410 could be, for example, a substrate for a printed wiring board, an Integrated Circuit die or wafer, or the like.

Figure 1:
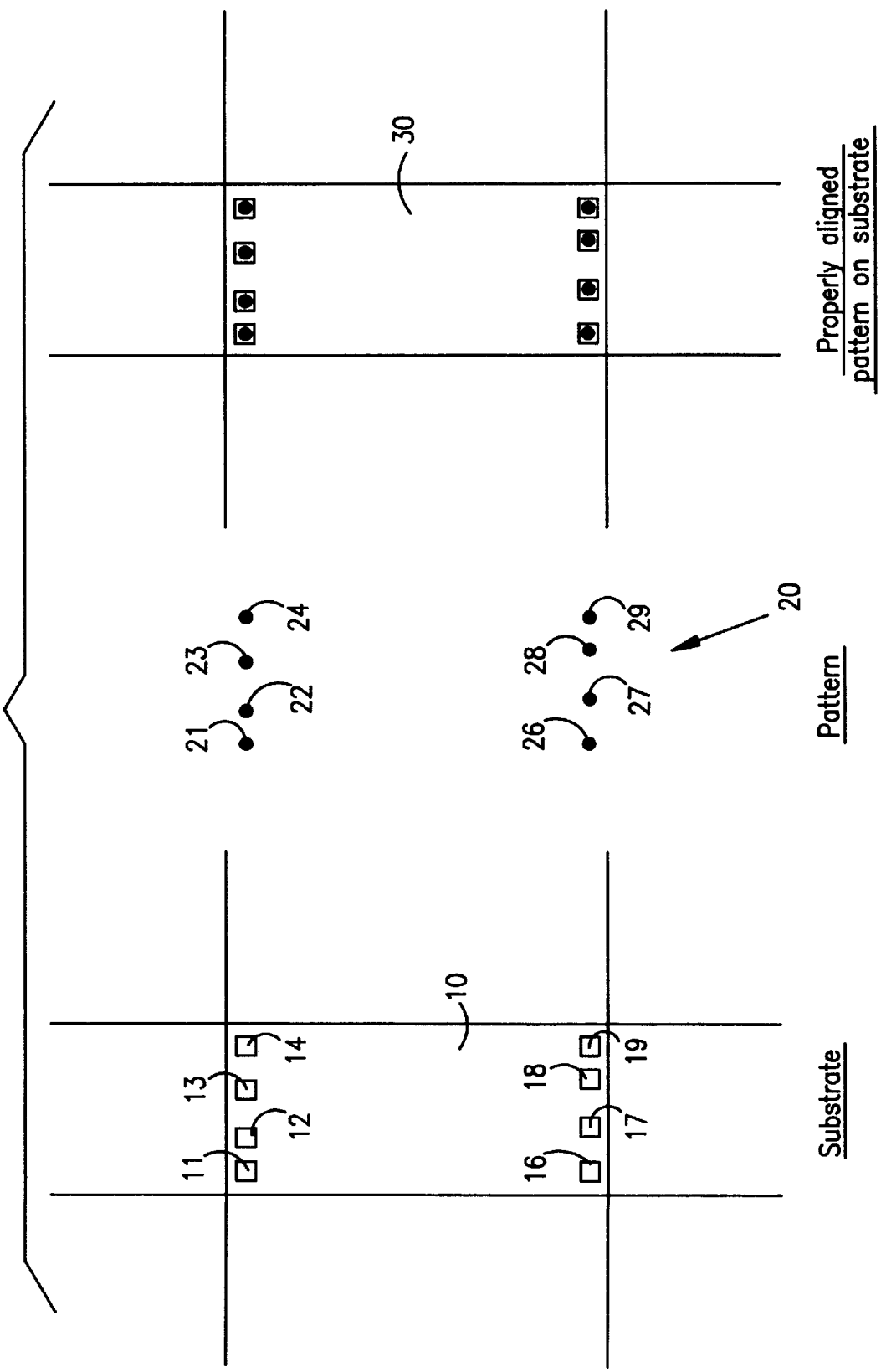
FIG. 1 illustrates a diagram of a substrate with a properly aligned pattern.
Figure 2:
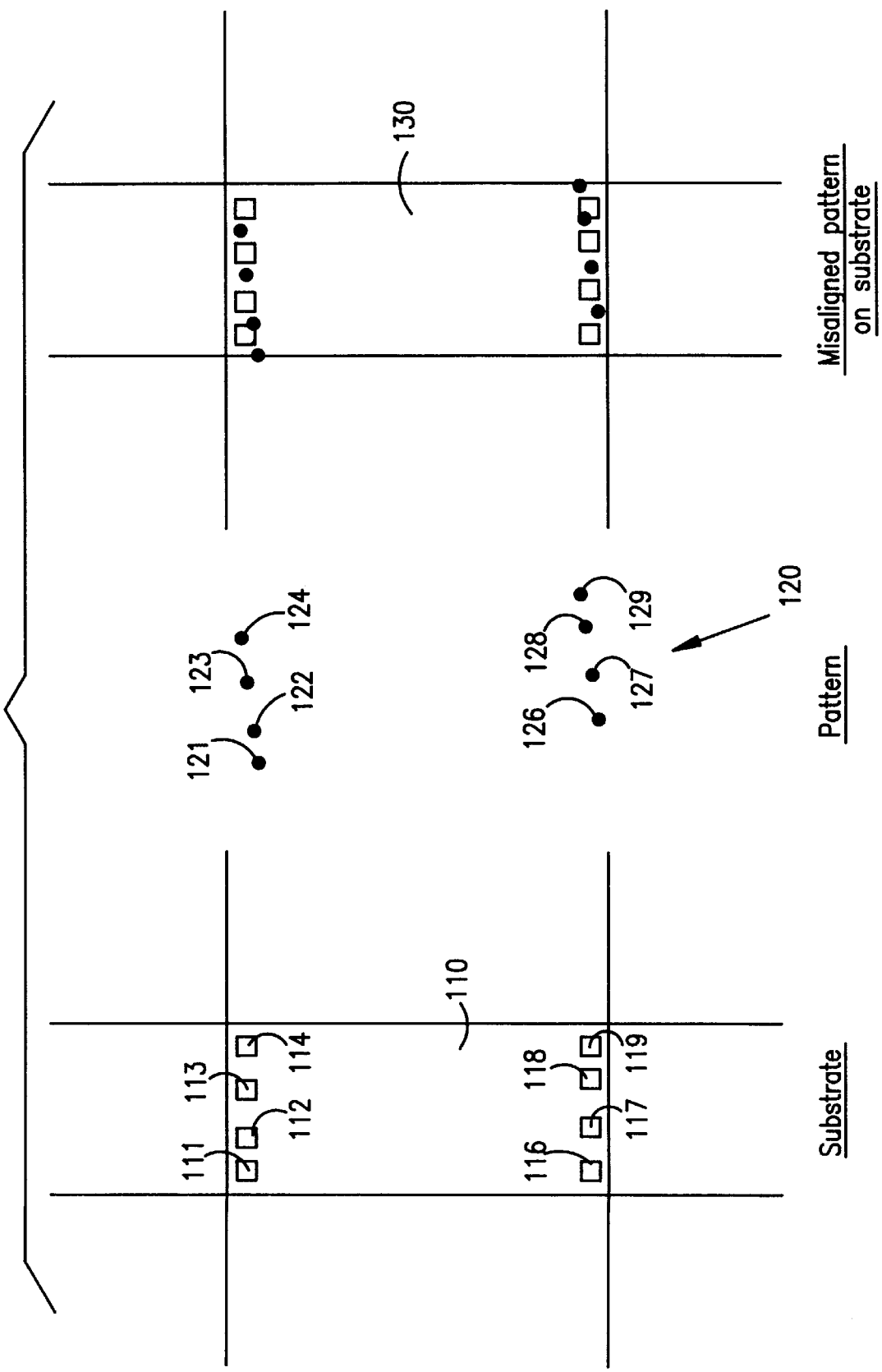
FIG. 2 illustrates a diagram of a substrate with a misaligned pattern.

Assume, for example, it is desired to print a pattern 20 as illustrated in FIG. 1 on target object 410 of FIG. 4. The first step is to coat the target object 410 with a removable barrier layer (step 300 of FIG. 3).

In accordance with a first embodiment of the present invention, target object 410 would be placed in a chamber filled with liquid carbon dioxide ($CO_2$). The temperature of the chamber must be monitored and maintained to ensure the $CO_2$ remains in a liquid state, i.e., the temperature of the chamber must be no more than −37° C. When target object 410 is placed in the chamber, a thin layer of frost from the liquid $CO_2$ will form on the surface of target object 410 and act as a barrier layer 430. Target object 410 is then removed from the chamber after barrier layer 430 is formed. The target object 410 is then subjected to a screen print process as is known in the art (step 310 of FIG. 3). The printed feature with adhesive 440 used to secure the pattern of the screen print will not be in direct contact with the target object 410, since the barrier layer 430 formed by the liquid $CO_2$ is disposed between the printed feature with adhesive 440 and target object 410.

An inspection is then made of the printed feature with adhesive 440 and target object 410 to determine if the pattern of the printed feature with adhesive 440 is properly aligned on the target object 410 (step 320 of FIG. 3). The inspection can be performed by either a microscopic visual inspection, an automatic optical inspection, or any other method suitable for determining the alignment of a pattern on an object. Additionally, alignment marks (not shown) may also be used to assist in the determination of whether or not the pattern is properly aligned. The alignment marks can be printed outside the area of the screen printing if the barrier layer 430 is opaque, preventing use of alignment marks within the screen printing region.

In this embodiment of the invention the time available to perform the inspection is limited, as once the target object 410 is taken out of the chamber, the barrier layer 430 formed by the liquid $CO_2$ will begin to evaporate when the temperature rises above −37° C. Thus, it may be necessary to keep the target object cooled to prevent the rapid evaporation of the liquid $CO_2$ layer before inspection can be completed. FIG. 5 illustrates one method for keeping the target object 410 of FIG. 4 cool to allow sufficient time for an inspection of the pattern alignment to occur. In accordance with this method, the target object 410 is placed on a cooling chuck 500. The cooling chuck 500 is used to maintain the target object 410 cool to prevent the $CO_2$ frost layer from evaporating too quickly. The cooling chuck can be kept to a predetermined temperature using any of the methods known in the art.

If it is determined that the printed feature with adhesive 440 is properly aligned on the target object 410 during the inspection, the target object 410 is maintained at room temperature. As the temperature of the target object 410 rises, the barrier layer 430 of liquid $CO_2$ will evaporate as the $CO_2$ returns to a gaseous state. When the $CO_2$ evaporates, the printed feature with adhesive will drop to the target object 410 and the adhesive of the printed feature 440 will adhere to the target object 410 (step 330 of FIG. 3).

If it is determined that the printed feature with adhesive 440 is not properly aligned on target object 410 (step 325 of FIG. 3), the printed feature with adhesive feature 440 and layer of liquid $CO_2$ can be easily removed from the target object 410 (step 325 of FIG. 3) utilizing a wiper squeegee or cloth (not shown). Since the printed feature with adhesive 440 was never in direct contact with the target object 410 due to the barrier layer 430, the adhesive of the printed feature 440 is not absorbed by the target object 410 and will not cause damage when removed. After removal of the barrier layer 430 and printed feature with adhesive 440, the target object can then be reworked, i.e., subjected to the screen printing process again, since there is no damage to the target object 410, and the process repeated until the printed feature with adhesive 440 is properly aligned on the target object 410.

In accordance with a second embodiment of the present invention, the barrier layer 430 as shown in FIG. 4 is formed by coating the target object 410 with a layer of rosin flux. The target object 410 is then subjected to a screen print process as is known in the art (step 310 of FIG. 3). The printed feature with adhesive 440 used to secure the pattern of the screen print will not be in direct contact with the target object 410, since the barrier layer 430 formed by the layer of rosin flux is disposed between the printed feature with adhesive 440 and target object 410.

An inspection is then made of the printed feature with adhesive 440 and target object 410 to determine if the pattern of the printed feature with adhesive 440 is properly aligned on the target object 410 (step 320 of FIG. 3). The inspection can be performed by either a microscopic visual inspection, an automatic optical inspection, or any other method suitable for determining the alignment of a pattern on an object. Additionally, alignment marks (not shown) may also be used to assist in the determination of whether or not the pattern is properly aligned. The alignment marks can be printed outside the area of the screen printing if the barrier layer 430 is opaque, preventing use of alignment marks within the screen printing region.

If it is determined that the printed feature with adhesive 440 is properly aligned on the target object 410 during the inspection, the target object 410 is subjected to heat in a baking process to remove the rosin flux layer by burning it off. Any temperature and time period sufficient to bake off the rosin flux layer may be used. When the rosin flux layer is removed, the printed feature with adhesive will drop to the target object 410 and the adhesive of the printed feature 440 will adhere to the target object 410 (step 330 of FIG. 3).

If it is determined that the printed feature with adhesive 440 is not properly aligned on target object 410 (step 325 of FIG. 3), the printed feature with adhesive feature 440 and solder flux layers can be easily removed from the target object 410 (step 325 of FIG. 3) utilizing a solution of isopropyl alcohol or any other substance in which rosin flux is soluble, as long as the chemical used will not cause damage to the target object 410. Since the printed feature with adhesive 440 was never in direct contact with the target object 410 due to the barrier layer 430, the adhesive of the printed feature 440 is not absorbed by the target object 410 and will not cause damage when removed. After removal of the barrier layer 430 and printed feature with adhesive 440, the target object can then be reworked, i.e., cleaned and subjected to the screen printing process again, since there is no damage to the target object 410, and the process repeated until the printed feature with adhesive 440 is properly aligned on the target object 410.

In accordance with a third embodiment of the present invention, the barrier layer 430 as shown in FIG. 4 is formed by coating the target object 410 with a layer of paraffin. The target object 410 is then subjected to a screen print process as is known in the art (step 310 of FIG. 3). The printed feature with adhesive 440 used to secure the pattern of the screen print will not be in direct contact with the target object 410, since the barrier layer 430 formed by the layer of paraffin is disposed between the printed feature with adhesive 440 and target object 410.

An inspection is then made of the printed feature with adhesive 440 and target object 410 to determine if the pattern of the printed feature with adhesive 440 is properly aligned on the target object 410 (step 320 of FIG. 3). The inspection can be performed by either a microscopic visual inspection, an automatic optical inspection, or any other method suitable for determining the alignment of a pattern on an object. Additionally, alignment marks (not shown) may also be used to assist in the determination of whether or not the pattern is properly aligned. The alignment marks can be printed outside the area of the screen printing if the barrier layer 430 is opaque, preventing use of alignment marks within the screen printing region.

If it is determined that the printed feature with adhesive 440 is properly aligned on the target object 410 during the inspection, the target object 410 is subjected to heat in a baking process to remove the paraffin layer by burning it off. Typically, exposing the target object 410 to a temperature of 200° C. for a period of 15 minutes is sufficient to bake off the paraffin layer, however, the method of the present invention is not so limited and any temperature and time period sufficient to bake off the paraffin layer may be used. When the paraffin layer is removed, the printed feature with adhesive will drop to the target object 410 and the adhesive of the printed feature 440 will adhere to the target object 410 (step 330 of FIG. 3).

If it is determined that the printed feature with adhesive 440 is not properly aligned on target object 410 (step 325 of FIG. 3), the printed feature with adhesive feature 440 and paraffin layers can be easily removed from the target object 410 (step 325 of FIG. 3) utilizing a solution of chloroform, acetone, isopropyl alcohol or any other substance in which paraffin is soluble, as long as the chemical used will not cause damage to the target object 410. Since the printed feature with adhesive 440 was never in direct contact with the target object 410 due to the barrier layer 430, the adhesive of the printed feature 440 is not absorbed by the target object 410 and will not cause damage when removed. After removal of the barrier layer 430 and printed feature with adhesive 440, the target object can then be reworked, i.e., cleaned and subjected to the screen printing process again, since there is no damage to the target object 410, and the process repeated until the printed feature with adhesive 440 is properly aligned on the target object 410.

Reference has been made to preferred embodiments in describing the invention. However, additions, deletions, substitutions, or other modifications which would fall within the scope of the invention defined in the claims may be found by those skilled in the art and familiar with the disclosure of the invention. Any modifications coming within the spirit and scope of the following claims are to be considered part of the present invention.

What is claimed as new and desired to be protected by Letters Patent of the United States is:

1. A method for screen printing a pattern on a surface of a semiconductor device substrate, said method comprising the steps of:

coating said semiconductor device substrate surface with a removable barrier layer;

screen printing said pattern on said removable barrier layer coated on said surface of said semiconductor device substrate;

determining if said screen printed pattern is properly aligned on said surface of said semiconductor substrate; and removing said removable barrier layer and said screen printed pattern from said surface of said semiconductor device substrate if said screen printed pattern is not properly aligned on said surface of said semiconductor substrate.

2. The method according to claim 1, further comprising: removing only said removable barrier layer from said surface of said semiconductor device substrate if said screen printed pattern is properly aligned.

3. The method according to claim 1, further comprising: removing said removable barrier and said screen printed pattern from said surface of said semiconductor device substrate without causing damage to said surface of said semiconductor-device substrate.

4. The method according to claim 2, further comprising: adhering said printed pattern to said surface of said semiconductor device substrate.

5. The method according to claim 1, wherein said coating step further comprises:

coating said semiconductor device substrate with a barrier layer formed of an evaporatable material.

6. The method according to claim 5, further comprising:

placing said semiconductor device substrate in a chamber with liquid carbon dioxide, whereby said removable barrier layer is formed by a layer of frost produced by said liquid carbon dioxide.

7. The method according to claim 6, wherein said determining step further comprises:

maintaining said semiconductor device substrate in a chilled state during said determination.

8. The method according to claim 1, wherein said removing said removable barrier layer and said screen printed pattern step further comprises:

wiping said surface of said semiconductor device substrate to remove said removable barrier layer and said screen printed pattern.

9. The method according to claim 1, further comprising the step of:

repeating said coating step, screen printing step, and removing step until said screen printed pattern is properly aligned on said surface of said semiconductor device substrate.

10. The method according to claim 2, wherein said removing only said removable barrier layer step further comprises:

allowing said barrier layer to evaporate; and adhering said pattern to said semiconductor device substrate.

11. The method according to claim 1, wherein said coating step comprises:

forming said removable barrier layer on said surface of said semiconductor device substrate with a layer of paraffin.

12. The method according to claim 1, wherein said coating step comprises:

forming said removable barrier layer on said surface of said semiconductor device substrate with a layer of rosin flux.

13. The method according to claim 11, wherein said removing said removable barrier layer and said screen printed pattern step comprises:

using a solvent to remove said layer of paraffin and said screen printed pattern from said surface of said semiconductor device substrate.

14. The method according to claim 12, wherein said removing said removable barrier layer and said screen printed pattern step comprises:

using a solvent to remove said layer of rosin flux and said screen printed pattern from said surface of said semiconductor device substrate.

15. The method according to claim 13, further comprising the step of:

repeating said coating step, screen printing step, and removing step until said screen printed pattern is properly aligned on said surface of said semiconductor device substrate.

16. The method according to claim 14, further comprising the step of:

repeating said coating step, screen printing step, and removing step until said screen printed pattern is properly aligned on said surface of said semiconductor device substrate.

17. The method according to claim 11, wherein said removing only said removable barrier layer comprises:

heating said semiconductor device substrate to bake off said layer of paraffin.

18. The method according to claim 12, wherein said removing only said removable barrier layer comprises:

heating said semiconductor device substrate to bake off said layer of rosin flux.

19. The method according to claim 17, wherein said heating is performed by exposing said semiconductor device substrate to a temperature of 200° C.

20. The method according to claim 1, wherein said removable barrier layer is formed of a material which is not reactive with said semiconductor device substrate, said printed pattern, or an adhesive used to secure said printed pattern.

21. A method for screen printing a pattern on a surface of a target object, said method comprising the steps of:

providing a temporary barrier layer on said surface of said target object;

screen printing said pattern on said temporary barrier layer on said surface of said target object;

inspecting said target object to determine if said screen printed pattern is properly aligned on said surface of said target object; and removing said temporary barrier layer and said screen printed pattern from said surface of said target object if said screen printed pattern is not properly aligned, wherein said surface of said target object is not damaged by said removal of said temporary barrier layer and said screen printed pattern.

22. The method according to claim 21, further comprising:

removing only said temporary barrier layer if said screen printed pattern is properly aligned on said surface of said target object; and adhering said screen printed pattern to said surface of said target object.

23. The method according to claim 22, wherein said temporary barrier layer is formed of a material that will evaporate from a liquid state to a gaseous state when exposed to room temperature.

24. The method according to claim 23, wherein said material is carbon dioxide.

25. The method according to claim 22, wherein said temporary barrier layer is formed of a material which burns off during a baking treatment.

26. The method according to claim 25, wherein said material is paraffin.

27. The method according to claim 25, wherein said material is rosin flux.

28. The method according to claim 21, wherein said temporary barrier layer is formed of a material which is not reactive with said target object, said pattern, or an adhesive used to secure said pattern to said target object.

29. An integrated circuit comprising:

a substrate;

a pattern screen printed on a surface of said substrate; and a removable barrier layer disposed between said surface of said substrate and said pattern, wherein said removable barrier layer and said screen printed pattern can be removed from said surface of said substrate if said screen printed pattern is not properly aligned on said surface of said substrate without damaging said surface of said substrate.

30. The integrated circuit according to claim 29, wherein said pattern adheres to said surface of said substrate when said removable barrier layer is removed.

31. The integrated circuit according to claim 29, wherein said removable barrier layer is formed of a material that will evaporate from a liquid state to a gaseous state when exposed to room temperature.

32. The integrated circuit according to claim 31, wherein said material is carbon dioxide.

33. The integrated circuit according to claim 29, wherein said removable barrier layer is formed of a material which burns off during a baking treatment.

34. The integrated circuit according to claim 33, wherein said material is paraffin.

35. The integrated circuit according to claim 33, wherein said material is rosin flux.

36. The integrated circuit according to claim 30, further comprising:

an epoxy based adhesive to adhere said pattern to said surface of said substrate when said removable barrier layer is removed.

37. A wafer comprising:

a substrate;

a removable barrier layer formed on a surface of said substrate; and a pattern screen printed on said surface of said substrate on top of said removable barrier layer, wherein said removable barrier layer and said screen printed pattern can be removed from said surface of said substrate if said screen printed pattern is not properly aligned on said surface of said substrate without damaging said surface of said substrate.

38. The wafer according to claim 37, wherein only said removable barrier layer is removed from said surface of said substrate if said screen printed pattern is properly aligned.

39. The wafer according to claim 38, wherein said screen printed pattern adheres to said surface of said substrate when said removable barrier layer is removed.

40. The wafer according to claim 39, further comprising:

an epoxy based adhesive to adhere said screen printed pattern to said surface of said substrate when said removable barrier layer is removed.

41. The wafer according to claim 38, wherein said removable barrier layer is formed of a material that will evaporate from a liquid state to a gaseous state when exposed to room temperature.

42. The wafer according to claim 41, wherein said material is carbon dioxide.

43. The wafer according to claim 38, wherein said removable barrier layer is formed of a material which burns off during a baking treatment.

44. The wafer according to claim 43, wherein said material is paraffin.

45. The wafer according to claim 43, wherein said material is rosin flux.

* * * * *